United States Patent
von Gutfeld et al.

(10) Patent No.: US 6,943,444 B2
(45) Date of Patent: Sep. 13, 2005

(54) COOLING OF SURFACE TEMPERATURE OF A DEVICE

(75) Inventors: Robert J. von Gutfeld, New York, NY (US); Hendrik Hamann, Yorktown Heights, NY (US); Michael T. Prikas, East North Valley Stream, NY (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 10/699,122

(22) Filed: Oct. 30, 2003

(65) Prior Publication Data

US 2005/0092007 A1 May 5, 2005

(51) Int. Cl.⁷ .............................................. H01L 23/34
(52) U.S. Cl. ...................................... 257/714; 361/689
(58) Field of Search ............................. 257/714, 717, 257/718, 719; 361/689

(56) References Cited

U.S. PATENT DOCUMENTS

| | | | |
|---|---|---|---|
| 4,628,990 A | | 12/1986 | Hagihara et al. |
| 4,631,636 A | * | 12/1986 | Andrews ............... 361/699 |
| 4,686,606 A | | 8/1987 | Yamada et al. |
| 4,758,926 A | | 7/1988 | Herrell et al. |
| 4,833,567 A | | 5/1989 | Saaski et al. |
| 4,912,548 A | | 3/1990 | Shanker et al. |
| 4,928,207 A | | 5/1990 | Chrysler et al. |
| 6,085,831 A | | 7/2000 | DiGiacomo et al. |
| 6,154,363 A | * | 11/2000 | Chang ............... 361/699 |
| 6,388,317 B1 | | 5/2002 | Reese |
| 6,411,507 B1 | | 6/2002 | Akram |
| 6,521,516 B2 | | 2/2003 | Monzon et al. |

FOREIGN PATENT DOCUMENTS

WO     WO92/22089     12/1992

OTHER PUBLICATIONS

"Miniature Refrigerators Built to Help a Computer Chip Keep its Cool," UC Santa Cruz Press Release, May 30, 2001, http://www.ucsc.edu/news_events/press_releases/archive/00–01/05–01/chip_cooler.html.

Schmidt, R.R. & Notohardjono, B.D., "High–End Server Low–Temperature Cooling," IBM J: Res. & Dev., vol. 46 No. 6, Nov., 2002, pp. 739–751.

* cited by examiner

*Primary Examiner*—Douglas Wille
(74) *Attorney, Agent, or Firm*—Wan Yee Cheung; Jon A. Gibbons; Fleit, Kain, Gibbons, Gutman, Bongini & Bianco P.L.

(57) ABSTRACT

A structure (microduct) for temperature management (e.g., cooling) of the surface temperature of an electronic device (e.g., a microprocessor). In an embodiment of the present invention, the system includes an upper plate, wherein the upper plate has a bottom surface forming the top portion and sides of the microduct structure, and wherein the top surface of a lower wall forms the bottom surface of the microduct structure. The lower wall can be adapted to be coupled to a top surface of device. The microduct structure further includes a coolant that flows through the microduct to provide cooling for a device.

18 Claims, 6 Drawing Sheets

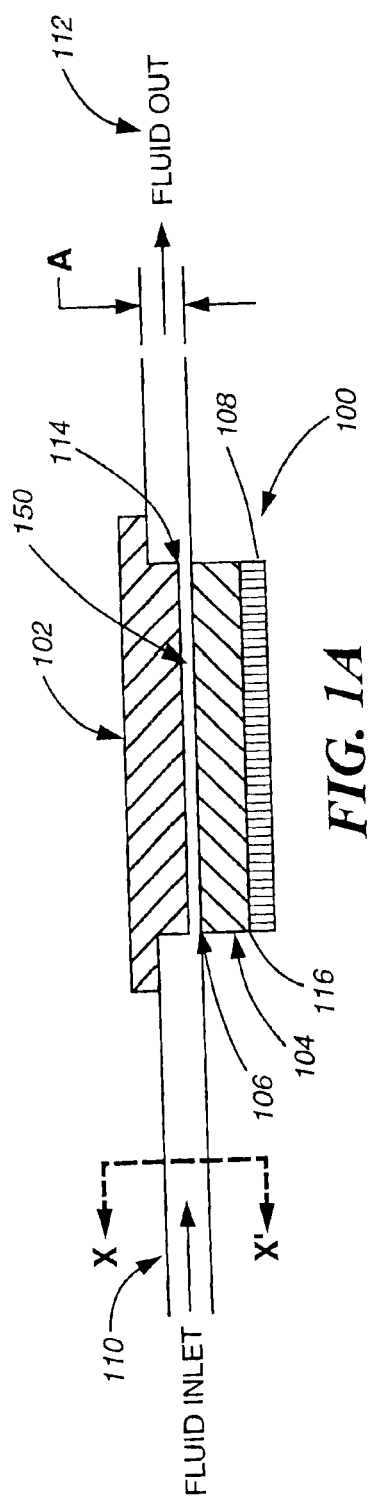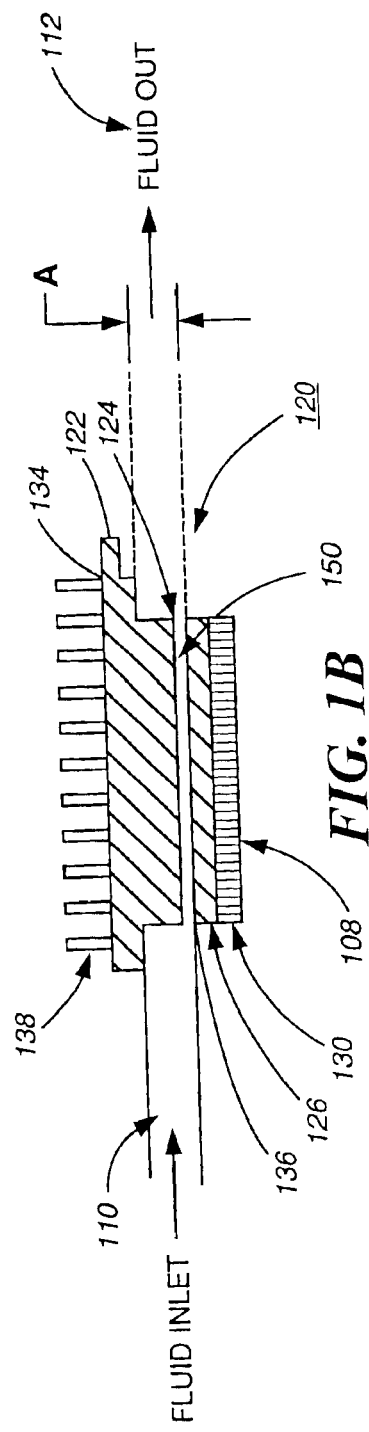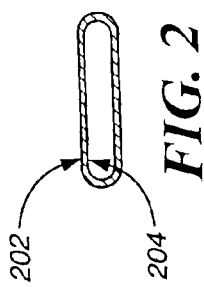

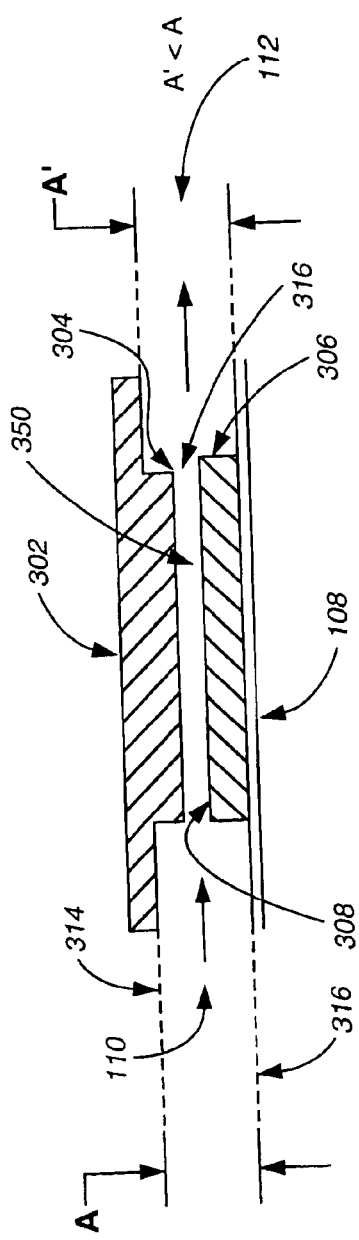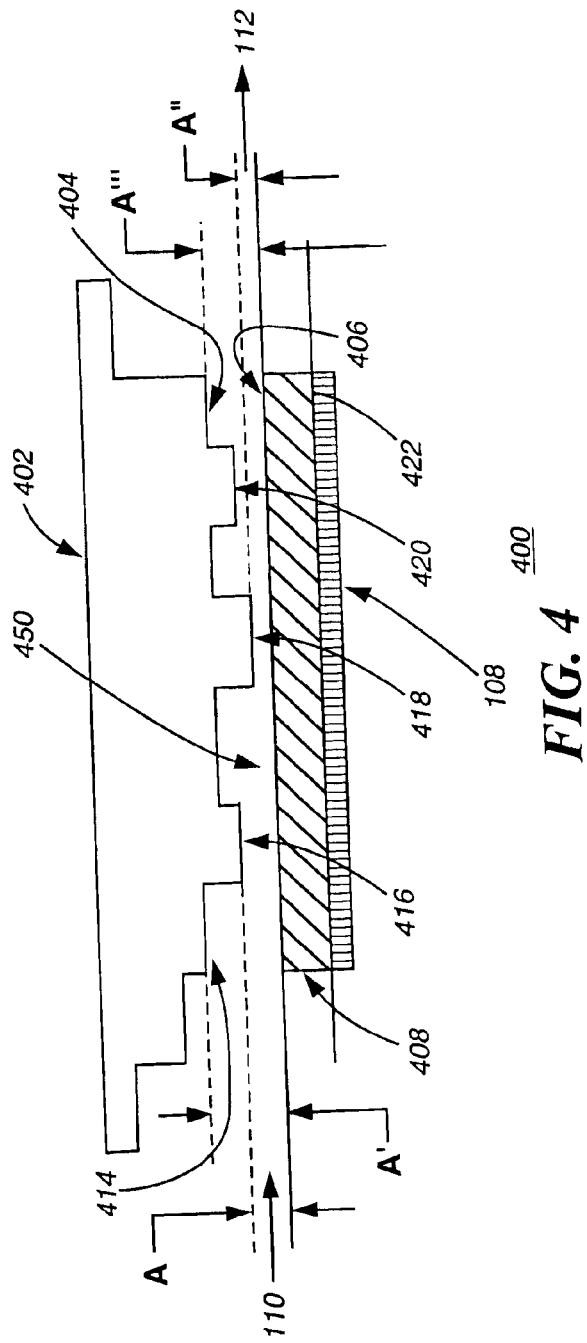

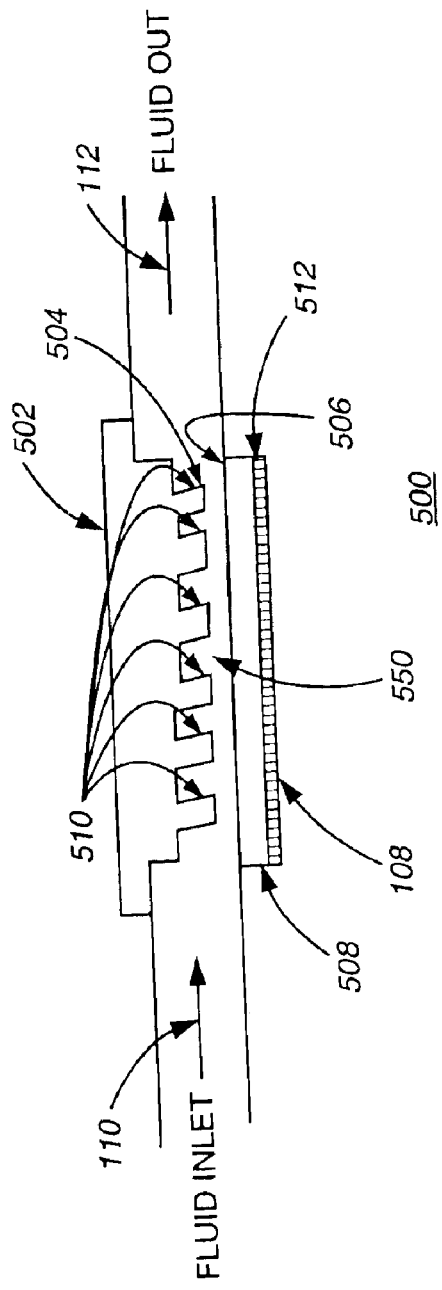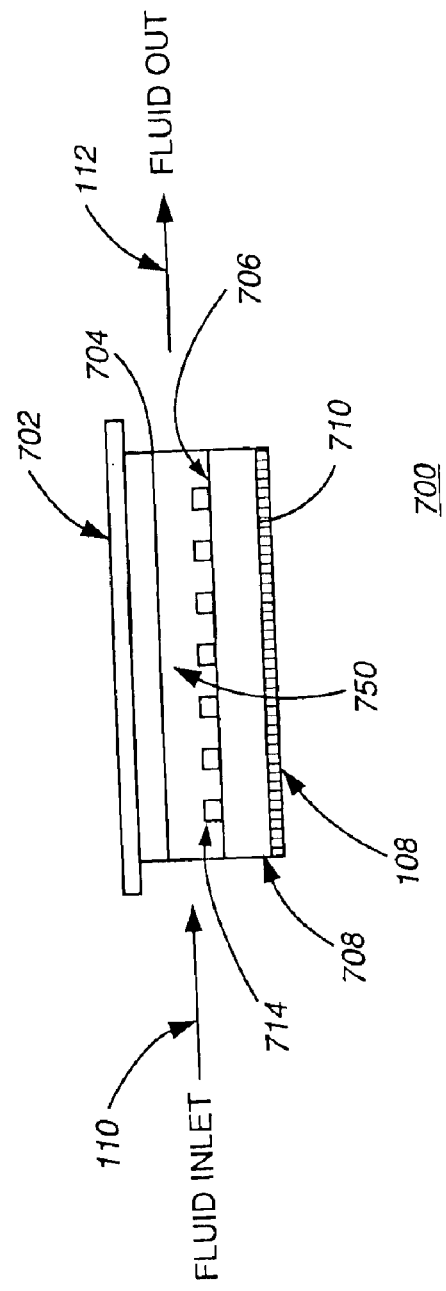

COOLING OF SURFACE TEMPERATURE OF A DEVICE

CROSS-REFERENCED APPLICATIONS

This non-provisional application is related to the following two non-provisional applications: (1) U.S. patent application Ser. No. XX/XXX,XXX, entitled "TRANSPARENT COOLING DUCT" filed on even date herewith, and (2) U.S. patent application Ser. No. XX/XXX,XXX, entitled "THERMAL MEASUREMENTS OF ELECTRONIC DEVICES DURING OPERATION", filed on even date herewith, which are hereby commonly assigned to International Business Machines Corporation and which are each hereby separately incorporated by reference in their entirety.

PARTIAL WAIVER OF COPYRIGHT

All of the material in this patent application is subject to copyright protection under the copyright laws of the United States and of other countries. As of the first effective filing date of the present application, this material is protected as unpublished material. However, permission to copy this material is hereby granted to the extent that the copyright owner has no objection to the facsimile reproduction by anyone of the patent documentation or patent disclosure, as it appears in the United States Patent and Trademark Office patent file or records, but otherwise reserves all copyright rights whatsoever.

FIELD OF THE INVENTION

This invention generally relates to the field of thermal management of device surface temperature and more specifically to cooling surface and therefore the interior temperatures of electronic devices.

DESCRIPTION OF RELATED ART

Thermal management is of great importance to the operation of electronic devices. Thermal management is especially important in the operation of silicon microprocessors as increasing frequency operating targets push power output, and therefore heat generation, to the limits of the cooling capacity of traditional passive, air-cooled, heat sink technology. Heat generation in silicon microprocessors continues to increase as the circuit density increases and as the overall dimensions of the microprocessors decrease. Thermal management includes the skill of dissipating the heat generated by an electronic device away from the device and allowing it to disperse to its surroundings. Insufficient transfer of heat away from an electronic device can result in performance and reliability degradation of that device or circuit. Typical thermal management solutions use aluminum or copper heat sinks, blowers or cooling 'hats' to keep an electronic device cool.

Another method that is widely under study to provide improved thermal management is the use of microchannels. The microchannel structures utilize a set of narrow channels that may be introduced into the chip itself or into a cooling member, which is in intimate contact with the microprocessor. In either case, the channels have heights and widths on the order of several 10's of microns and are encapsulated either by the microprocessor or the cooling member in intimate contact with the microprocessor resulting in an array of micron sized rectangular tubes through which a cooling liquid is forced to provide the means for dissipating heat generated within the microprocessor.

As a further complication, the heat load on a microprocessor, which depends on the workload of the microprocessor, is unevenly distributed over the area of the microprocessor die (e.g., the temperature profile of an operational chip will vary based on the workload of the microprocessor). The variances in workload of the microprocessor result in the generation of local hot spots or temperature gradients. Thus, there is a pressing need for new methods of thermal management (cooling) of microprocessors both on an overall device scale and on a local hot-spot scale.

Many of the current generations of electronic devices exceed the ability of current passive air-cooled heat sink technology to effectively manage the thermal environment of the integrated circuit. Even the use of certain liquid cooling techniques, such as the microchannel method, does not provide the flexibility or efficiency needed for proficient thermal management of microprocessors. Furthermore, the microchannel method raises numerous fabrication challenges as well as access difficulties with respect to the liquid cooling fluid connections.

Therefore a need exists to overcome the problems with the prior art as discussed above, and particularly for ways to more efficiently provide thermal management of the surface temperature of a microprocessor during operation, especially for those areas that contain local hot spots.

SUMMARY INVENTION

Briefly, in accordance with the present invention, disclosed is a structure (microduct) for temperature management (e.g., cooling) the surface temperature of a device (e.g., a microprocessor). A structure (microduct) for temperature management (e.g., cooling) of the surface temperature of an electronic device (e.g., a microprocessor) during operation. In an embodiment of the present invention, the system includes an upper plate (e.g., which may also serve as a heat sink), where the upper plate has a top surface and a bottom surface and where the bottom surface of the upper plate forms the top portion and sides of the microduct structure, and where the top surface of a lower wall forms the bottom surface of the microduct structure. The lower wall is adapted to be coupled to a top surface of an electronic device. The microduct structure further includes a coolant that flows through the microduct to cool the electronic device. In another embodiment of the present invention, the top surface of a device forms the bottom wall of the microduct structure.

The foregoing and other features and advantages of the present invention will be apparent from the following more particular description of the preferred embodiments of the invention, as illustrated in the accompanying drawings.

BRIEF DESCRIPTION OF THE DRAWINGS

The subject matter, which is regarded as the invention, is particularly pointed out and distinctly claimed in the claims at the conclusion of the specification. The foregoing and other features and also the advantages of the invention will be apparent from the following detailed description taken in conjunction with the accompanying drawings.

FIG. 1A is a cross sectional diagram depicting the microduct structure of one embodiment of the present invention.

FIG. 1B is a cross sectional diagram depicting the microduct structure of one embodiment of the present invention.

FIG. 2 is a diagram illustrating the cross-section of the fluid inlet and outlet used by one embodiment of the present invention.

FIG. 3 is a cross sectional diagram depicting one embodiment of the present invention.

FIG. 4 is a cross sectional diagram depicting another embodiment of the present invention.

FIG. 5 is a cross sectional diagram depicting another embodiment of the present invention.

FIG. 7 is a cross sectional diagram depicting another embodiment of the present invention.

DETAILED DESCRIPTION OF THE PREFERRED EMBODIMENTS

Figure 6:
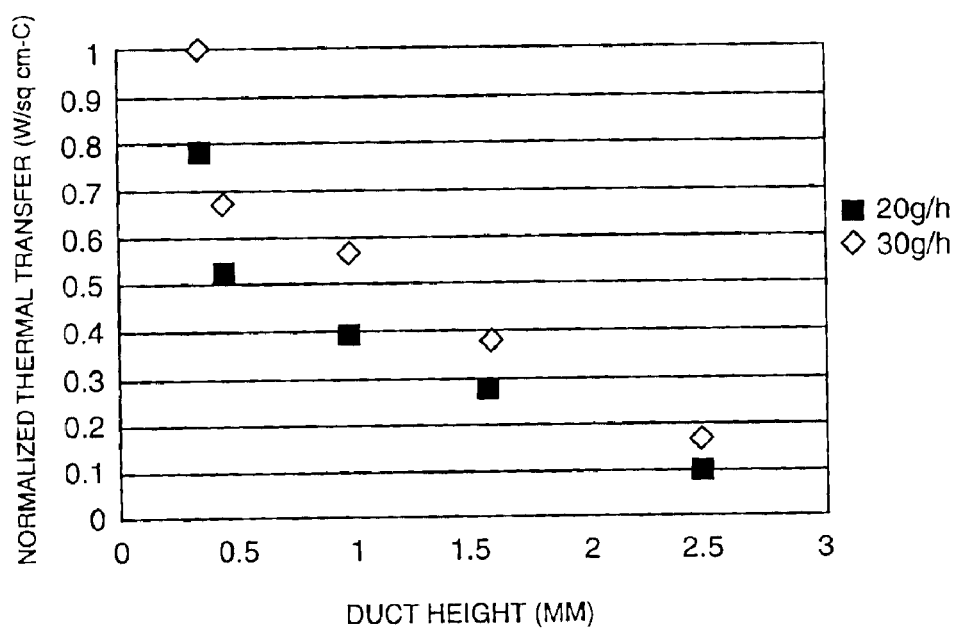
FIG. 6 is a graphical representation of test results for utilizing the convective cooling theory employed by the various embodiments of the present invention.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality. In the drawing like numerals refer to like parts through several views.

The present invention, according to a preferred embodiment, overcomes problems with the prior art by providing an efficient and easy-to-implement structure for cooling the surface temperature of a device (e.g., a microprocessor).

OVERVIEW

In order to provide thermal management for the surface temperatures of a device (e.g., a microprocessor) under operating conditions, several embodiments are disclosed to reduce the surface temperature of the device (e.g., a microprocessor). In an embodiment of the present invention, the system includes an upper plate (e.g., heat sink), where the upper plate has a top surface and a bottom surface and where the bottom surface of the upper plate forms the top portion and sides of the microduct structure, and where the top surface of a lower wall forms the bottom surface of the microduct structure. The lower wall is adapted to be coupled to a top surface of an electronic device. Other embodiments utilize a narrow spacing between a device (e.g., a microprocessor), which forms one side of a microduct, and a bottom surface of an upper plate, which forms the top surface of the microduct thereby forming a liquid flow cell (or microduct), narrow in one dimension (height) on the order of 100 microns while the lateral dimension may be on the order of 2 cm. A cooling fluid (e.g., water, alkanes, alcohol, hexane, perfluorooctane) is pumped through the microduct from an orifice whose height is considerably larger than the vertical spacing or height of the flow cell microduct.

This difference in height between the fluid inlet orifice and the flow cell microduct causes a large increase in the rate of fluid flow (as well as some turbulence) in the narrow region to be cooled since total fluid mass per unit time has to be conserved. The increase in flow rate of the coolant in turn provides additional temperature management since the rate of cooling is proportional to the Reynolds number, which in the present case is only dependent on the total fluid flow and independent of the microduct height. The Reynolds number is proportional to the flow velocity times the duct height. On the other hand the velocity is proportional to the flow rate divided by the cross sectional area of the duct. Thus the duct height appears in the numerator and the denominator of the Reynolds number and cancels, leaving the flow rate or mass of fluid flow per unit time as part of the Reynolds number.

For simple ducts, the convective heat flow or thermal transfer coefficient $h_c$, is related in the following manner as shown by the following equations For convective cooling, the following equation is standard for a uniform duct. While the present invention is more complicated from a single straight duct structure, the standard equation is useful in understanding the novel invention.

The following parameters are generally used:

$h_c$=convective thermal or heat transfer coefficient,

D=effective duct gap height,

L=length of the duct, $\mu$=fluid dynamic viscosity, $\upsilon$=fluid velocity, $\rho$=fluid density, F=flow rate of coolant $^{mass}/_{time}$ $\lambda$=thermal conductivity of coolant, $\mu_s$=viscosity at the heated surface $C_p$=heat capacity of coolant For a rectangular duct, $$D = \frac{2ab}{a+b},$$

where a is the duct width, b, the duct height

For a >>b, D=2b

From the definition of F and the continuity of flow throughout the duct, the velocity can be derived:

$$\upsilon = \frac{F}{a \times b} = \frac{2F}{a \times D}$$

The coolant equation can be written in terms of well-known dimensionless qualities, i.e. the Reynolds number, Re, the Nusselt number, Nu, and the Prandtl number, Pr, where, $$Re = \frac{\upsilon \rho D}{\mu}, \quad Pr = \frac{\mu C_p}{\lambda} \text{ and } Nu = \frac{h_c D}{\lambda}$$

From thermodynamic textbooks, it is found that for laminar flow,

Equation 1:
$$Nu = 1.86(Re)^{1/3}(Pr)^{1/3}\left(\frac{D}{L}\right)^{1/3}\left(\frac{\mu}{\mu_s}\right)^{0.14}$$

and that

Equation 2:
$$Nu = \frac{h_c D}{\lambda}$$

Now, substituting for Nu in equation 1 using equation. 2, $$h_c = 1.86(Re)^{1/3}(Pr)^{1/3}\left(\frac{D}{L}\right)^{1/3}\left(\frac{\lambda}{D}\right)\left(\frac{\mu}{\mu_s}\right)^{0.14}$$

From before, Re is independent of D when substituting for $\upsilon$, since Re can then be written as, $$Re = \frac{F}{a \times D} \frac{pD}{\mu}$$

where the D's cancel $$h_c = \left(\frac{Fp}{a\mu}\right)^{1/3}(Pr)^{1/3}\left(\frac{D}{2}\right)^{1/3}\left(\frac{\lambda}{D}\right)$$

Thus, for a given duct, where flow rate F and duct height D can vary, $$h_c \approx (F)^{1/3}\left(\frac{1}{D^{2/3}}\right)$$

This relation has been found to apply approximately to our data even though the power of F and $$\frac{1}{D}$$

may vary from the above values. In general, we find that $h_c$ always increases with and $$\frac{1}{D}.$$

By decreasing the height of the duct, the equation shows that the thermal transfer coefficient is proportional to the mass flow rate to the ⅓ power and inversely proportional to the duct height, D as1/D to the ⅔ power. While this equation holds only very approximately for our duct design, it indicates the direction in which the coefficient can be made to increase which is in part incorporated in our duct design, mainly through the small duct height, b. Our design makes it possible to create a flow channel with very small b, the height, without having to use microchannels which involve considerable processing and also make it difficult to connect a fluid to the openings. Our design avoids having to have a long narrow channel or duct region, which would necessitate having a very high pressure to force the water through the duct.

A microduct structure is illustrated in FIGS. 1A and 1B, the latter with additional cooling fins mounted on top of the upper plate of the microduct. In all cases, the inlet and outlet sections of the microduct are much larger in cross-sectional area than the duct region. This is accomplished by making the height of the inlet and outlet ports considerably larger than the duct height thereby minimizing the required fluid pressure to the flow system. FIG. 1A is a cross-sectional diagram depicting the microduct system 100 of one embodiment of the present invention. FIG. 1A shows an upper plate 102, having a bottom surface 114, an electronic device 104 having an upper surface 106 and a bottom surface 116, a fluid inlet 110, a fluid outlet 112, and a circuit board 108. The bottom surface 114 of the upper plate 102 serves as the top of the microduct 100 and provides the microduct 100 with sidewalls. The upper surface 106 of the electronic device 104 serves as the bottom of the microduct 100. FIG. 1A demonstrates that the microduct structure 100 has a constant duct height in the region between the top 114 of the microduct 100 and the bottom 106 of the microduct 100. In FIG. 1A a gap 150 is identified for the microduct 100.

FIG. 1B is a cross-sectional diagram depicting the microduct system 120 of one embodiment of the present invention. FIG. 1B shows an upper plate 122, having a bottom surface 124, an electronic device 126 having an upper surface 136 and a bottom surface 138, a fluid inlet 110, a fluid outlet 112, and a circuit board 108. The bottom surface 124 of the upper plate 122 serves as the top of the microduct 120 and provides the microduct 120 with sidewalls. The upper surface 136 of the electronic device 126 serves as the bottom of the microduct 120. Cooling fins 138 are mounted on the top surface 134 of upper plate 122 to provide additional cooling. FIG. 1B shows the microduct structure 120 to have a constant duct height in the region between the top 124 of the microduct 120 and the bottom 136 of the microduct 120. Distance a is shown to illustrate a constant duct height along the length of the microduct In FIG. 1B a gap 150 is identified for the microduct 120.

FIG. 2 illustrates a cross-section of the fluid inlet and outlet 200 used by one embodiment of the present invention. This view shows that the diameter of the microduct 204 (not to scale) is less than the diameter of the fluid inlet or outlet 202 (not to scale). The narrowing of the liquid flow path due to the microduct structure causes the increase in fluid velocity in the microduct region.

FIG. 3 is a cross-sectional diagram depicting the microduct system 300 of one embodiment of the present invention. The exemplary microduct system 300 includes an upper plate 302, having a bottom surface defined by points 314 and 304, an electronic device 306 having an upper surface 316 and a bottom surface 308, a fluid inlet 110, a fluid outlet 112, and a circuit board 108. The bottom surface defined by points 314 and 304 of the upper plate 302 serves as the top of the microduct 300 and provides the microduct 300 with sidewalls. The upper surface 316 of the electronic device 306 serves as the bottom of the microduct 300. FIG. 3 shows the microduct 300 structure to be slanted in such a way that the part of the chip nearest the input receives the least cooling (at the larger duct height, A which is the distance from point 314 to 316) with the far end of the chip receiving the maximum cooling, (smallest duct height A' which is the distance from point 304 to 316) Distances A, and A' are shown to illustrate the varying duct heights along the length of the microduct. This embodiment is useful to maximize the cooling power of a recirculating fluid in which only a total given amount of cooling power is available. The coefficient of thermal transport or cooling is approximately proportional to 1/D to the ⅔ power. Therefore, it is clear that by the time the flowing liquid reaches the end of the duct the coolant will already be somewhat heated. Thus, a faster rate of cooling is supplied at the farther end of the duct to make up for the fact that the fluid is warmer by decreasing D, which enhances the cooling transport coefficient, $h_c$. Thus, the entering cooling fluid becomes heated at the first portion of the microduct; more cooling is necessary and is made available by narrowing the microduct height near the exit end of the heat source. In FIG. 3 a gap 350 is identified for the microduct 300.

FIG. 4 is a cross-sectional diagram depicting the microduct system 400 of one embodiment of the present invention. FIG. 4 shows an upper plate 402, having a bottom surface having varying duct heights along the length of the microduct 400 as defined by points 414, 416, 418, 420 and 404, an electronic device 408 having an upper surface 406 and a bottom surface 422, a fluid inlet 110, a fluid outlet 112, and a circuit board 108. The bottom surface defined by points 414, 416, 418, 420 and 404 of the upper plate 402 serves as the top of the microduct 400 and provides the microduct 400 with sidewalls. The upper surface 406 of the electronic device 408 serves as the bottom of the microduct 400. The varying duct heights or vertical ribs 414, 416, 418, 420 and 404 extend into the microduct 400 at different depths depending on the required cooling. For example, the required cooling will be known from mapping the temperature profile of an operational processor chip. Once the spatial thermal profile is known, the varying duct heights or vertical ribs 414, 416, 418, 420 and 404 are located in a direction perpendicular to the direction of the cooling fluid flow. Alternatively the vertical ribs can be oblique and should span the entire width of the duct. In this embodiment, the deeper the varying duct heights or vertical ribs 414, 416, 418, 420 and 404 extend into the microduct 400, the more cooling provided in that local region. The upper plate 402 will have a set of varying duct heights or vertical ribs 414, 416, 418, 420 and 404 that conform to the temperature profile of the operational chip. With the flow at right angles to the varying duct heights or vertical ribs 414, 416, 418, 420 and 404, differential cooling will result with the hottest spots on the electronic device 408 receiving the most cooling because they will be the regions that have the narrowest spacing between the electronic device 408 and the varying duct heights or vertical ribs 414, 416, 418, 420 and 404 for the fluid flow (hence generating the greatest amount of cooling).

Distances A, A', A'' and A''' are shown to illustrate the varying duct heights along the length of the microduct. These varying heights will have varying cooling rates, again because the coefficient, $h_c$, is approximately proportional to 1/D to the ⅔ power. In FIG. 4, a gap 450 is identified for the microduct 400.

Additional cooling power may also be obtained by inducing turbulence to the fluid flow. While the structure in itself will cause some turbulence because of the step leading from the input to the narrow duct, additional turbulence may be caused by using slanted grooves 510 in the microduct structure 500 as shown in FIG. 5, depending on the angle at which the water is incident on the grooves. FIG. 5 is a cross-sectional diagram depicting the microduct system 500 of one embodiment of the present invention. FIG. 5 shows an upper plate 502, having a bottom surface 504 with slanted grooves 510, an electronic device 508 having an upper surface 506 and a bottom surface 512, a fluid inlet 110, a fluid outlet 112, and a circuit board 108. The bottom surface 504 with slanted grooves 510 of the upper plate 502 serves as the top of the microduct 500 and provides the microduct 500 with sidewalls. The upper surface 506 of the electronic device 508 serves as the bottom of the microduct 500. FIG. 5 shows the microduct 500 structure to contain slanted grooves 510, which produce a more turbulent flow than the basic laminar flow shown produced by the embodiment of FIG. 1A. In FIG. 5, a gap 550 is identified for the microduct 500.

By comparing expressions for laminar flow and turbulent flow (i.e., taking the ratio of turbulent to laminar flow cooling coefficients as known in the industry, one may demonstrate that for microduct dimensions of 2 cm (microduct width) by 100 microns (microduct height) an additional cooling factor of four (4) can be achieved in the thermal cooling coefficient. The structure shown in FIG. 5 is an example of a structure that increases the turbulence. Stated differently, the microduct structure is formed with a ratio of the width (W) (or alternatively length) which as a ratio to the height is approximate range that is an order of magnitude higher i.e. W/L>10.

Figure 9:
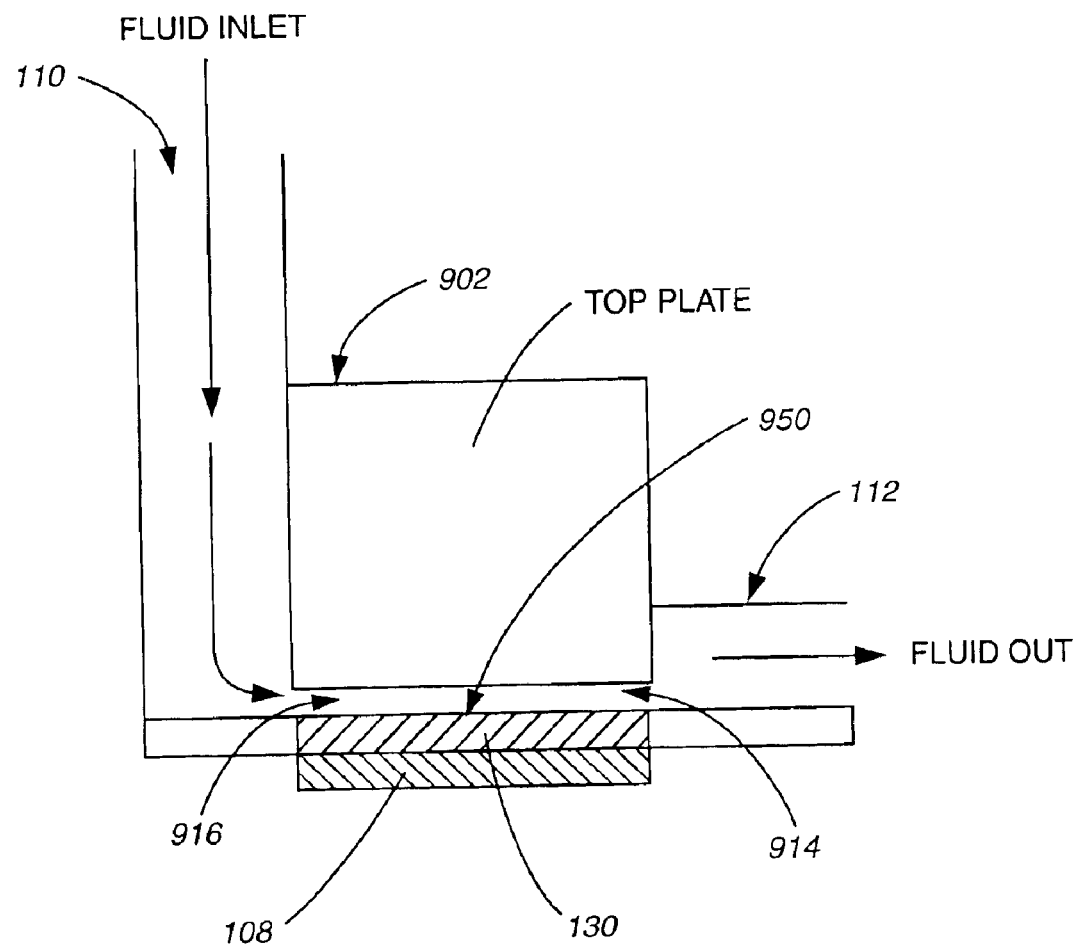
FIG. 9 is a cross-sectional diagram depicting another embodiment of the present invention where the coolant enters from the top causing turbulence, which enhances the cooling coefficient.

FIG. 9 is a cross-sectional diagram depicting the microduct system 900 of one embodiment of the present invention. FIG. 9 shows an upper plate 902, having a bottom surface 914 an electronic device 908 having an upper surface 916 and a bottom surface 918, a fluid inlet 110, a fluid outlet 112, and a circuit board 108. The bottom surface 914 of the upper plate 902 serves as the top of the microduct 900 and provides the microduct 900 with sidewalls. The upper surface 916 of the electronic device 908 serves as the bottom of the microduct 900. FIG. 9 demonstrates that the fluid can enter the microduct 900 from above, which also causes additional turbulence and has been shown experimentally to increase the coefficient $h_c$. In FIG. 9, a gap 950 is identified for the microduct 900.

The theory for convective cooling is employed by the above microduct structure (for additional information on the convective cooling theory see Engineering Thermodynamics with Applications by M. David Burghardt, 2nd edition, Harper Row, pages 474–477 (1982)), which is incorporated by reference in its entirety. Representative data from experiments utilizing a variety of microduct heights and several fluid flows (volume/second) indicate the effectiveness of the inventive structure for cooling silicon chips. Data measurements are shown in FIG. 6 for experiments that utilized a steel sample, approximately 1.8×1.8 cm in area, 1 mm in thickness. The x-axis identifies various duct heights, while the y-axis identifies the convective cooling coefficient $h_c$. Two fluid velocity flow rates, 20 and 30 gallons per hour are identified in the drawing as a square symbol and a diamond symbol, respectively. The steel sample was heated from its bottom surface. The data demonstrates that the convective cooling coefficient, $h_c$ (in normalized units of W/cm$^2$-° C.) increases with decreasing duct height and increasing fluid flow (volume/second) traversing the microduct structure of FIG. 4. The device is arranged to have elliptical fluid inputs and outputs in order to provide a more uniform distribution of the cooling fluid entering and exiting the microduct flow cell. The test data results from the steel plate experiment, Illustrated in FIG. 6, are equally applicable to silicon electronic devices.

FIG. 7 is a cross-sectional diagram depicting the microduct system 700 of one embodiment of the present invention. FIG. 7 illustrates an upper plate 702, having a bottom surface 704, an electronic device 708 having an upper surface 706 and a bottom surface 710, a fluid inlet 110, a fluid outlet 112, and an electronic circuit board 108 onto which is mounted and the top of an electronic device 708 serving as the bottom of the microduct-circuit The bottom surface 704 of the upper plate 702 serves as the top of the microduct 700 and provides the microduct 700 with sidewalls. The upper surface 706 of the electronic device 708 serves as the bottom of the microduct 700. Small structures 714 are either etched into the silicon of the electronic device 708 or deposited onto the backside of the electronic device 708. These small structures 714 offer greater surface area to the coolant due to their sidewalls and thus increase the rate of heat transfer from the electronic device 708. This increase in cooling will, in certain circumstances, allow the coolant flow rate to be reduced with the accompanying advantage of a reduction in fluid input pressure to the duct. In FIG. 7, a gap 750 is identified for the microduct 900.

Figure 8:
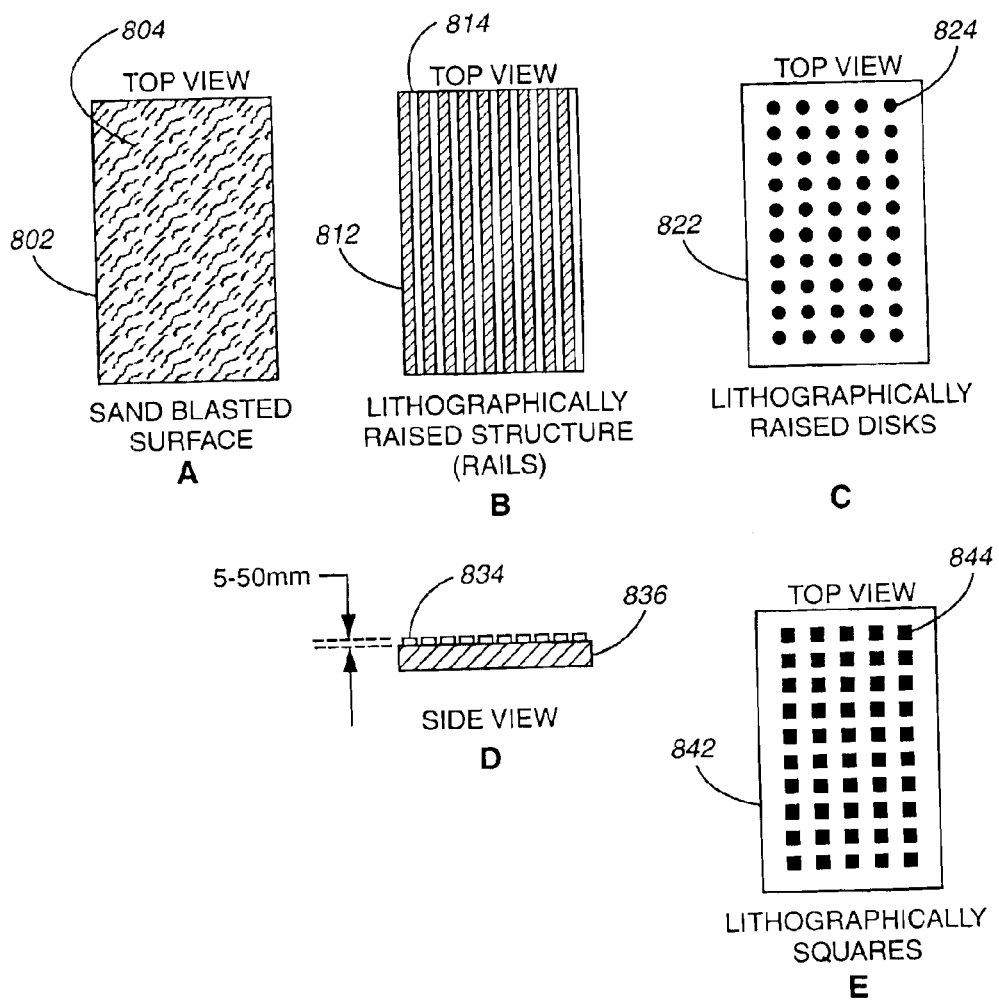
FIG. 8A is a top view illustration showing a device surface that has been roughened by sandblasting.
FIG. 8B is a top view illustration showing a device surface that has rails etched into a device surface.
FIG. 8C is a top view illustration showing a device surface that has raised disks deposited on a device surface.
FIG. 8D is a side view of FIG. 8B showing a device surface that has rails etched or deposited onto a device surface.
FIG. 8E is a top view illustration showing a device surface that has raised square disks deposited on a device surface.

FIG. 8B illustrates another of the proposed embodiments which utilizes rows of small rails or mini-fins 814 that can be deposited lithographically, closely spaced to one another, running parallel along the length of the electronic device surface 814 that may be used as the bottom wall of the microduct 700, in the direction of the cooling fluid flow. These structures 814 can consist of any reasonably high thermal conducting material such as aluminum or the like. It is important to assure that the deposited material is not one that diffuses into silicon. If the material does diffuse, a barrier layer of a suitable non-diffuser such as nickel is first deposited. A very thin nonmetallic layer, on the order of 200 angstroms, can also be used as a barrier layer prior to the deposition of the small metallic rails or walls. The spacing between these rails can be on the order of 50 microns while the height can vary from 5–50 microns. The width of the walls can vary from approximately 5 to 20 microns.

FIG. 8D depicts a side view of the FIG. 8B. The rails 834 are etched or deposited on an electronic device surface 836 (not indicated in drawings).

As illustrated in FIG. 8C, instead of rails, an array consisting of rows of small spaced disks of metal 824 (not indicated in drawings) can be deposited on the electronic device surface 822 (not indicated in drawings) undergoing cooling by the microduct structure. The disks might typically be on the order of 50 microns in diameter and range from 5 to 50 microns in height. Within a row, the disks can be separated on the order of 50 microns while each row of disks is also separated by 50 to 100 microns depending on the disk diameter. FIG. 8E (not indicated in drawings) illustrates that small sets of square or rectangular deposits 844 can also be used. One advantage of disks 824 and/or squares 844 compared to rails or min-fins 814 is that disks 824 are more likely to cause turbulence of the coolant in the microduct, which enhances overall cooling performance.

In addition, as illustrated in FIG. 8A, another way to enhance the cooling is to roughen the device surface 802 of the silicon either by etching or sandblasting 804. Similarly, closely spaced grooves can be etched into the silicon surface using lithographic techniques. The grooves can also be obtained by imaging a diffraction pattern onto the silicon using optically enhanced etching techniques.

CONCLUSION

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

What is claimed is:

1. A microduct structure to provide temperature management to a device, comprising:
   an upper plate, wherein the upper plate contains a bottom surface forming a top portion and sides of the microduct structure; and
   a lower wall forming a bottom portion of the microduct structure, wherein the lower wall is adapted to be coupled to a top surface of the device;
   wherein the microduct structure has a height and a width, wherein the width of the microduct structure has an order of magnitude of length greater than the height of the microduct structure.

2. The structure of claim 1, further comprising:
   an inlet and an outlet capable of accepting a coolant, wherein the inlet and outlet are communicatively coupled to the microduct structure.

3. The structure of claim 1, further comprising:
   one or more cooling fins attached to a top surface of the upper plate.

4. The structure of claim 2, wherein the bottom surface of the upper plate has a greater height at the inlet of the microduct structure and a lower height at the outlet of the microduct structure to provide greater cooling capability at the end of the microduct structure.

5. The structure of claim 2, wherein the bottom surface of the upper plate has a plurality of ribs protruding into the microduct structure in a direction perpendicular to the direction of flow of the coolant, wherein the lengths of the plurality of ribs vary to provide differential cooling to the electronic device.

6. The structure of claim 5, wherein the plurality of ribs are mapped to a thermal profile of the device.

7. The structure of claim 2, wherein the bottom surface of the upper plate contains one or more grooves projecting at oblique angles from the bottom surface of the upper plate to produce greater turbulence to the coolant flow.

8. A microduct structure to provide temperature management to a device, comprising:
   a device, wherein a top surface of the device forms a bottom surface of the microduct structure; and
   an upper plate, wherein the upper plate has a bottom surface forming a top portion and sides of the microduct structure;
   wherein the microduct structure is a height and a width, wherein the width of the microduct structure is an order of a magnitude of greater than the height of the microduct structure.

9. The structure of claim 8, further comprising:
   an inlet and an outlet capable of accepting a coolant, wherein the inlet and outlet are communicatively coupled to the microduct structure.

10. The structure of claim 9, further comprising small structures etched into the top surface of the device.

11. The structure of claim 9, further comprising small structures deposited onto the top surface of the device.

12. The structure of claim 11, wherein the small structures form one or more rows of small rails.

13. The structure of claim 11, wherein the small structures form one or more rows of fins.

14. The structure of claim 12, wherein the small structures deposited onto the top surface of the electronic device include one or more geometric shapes of metal, wherein the geometric shapes of metal are shapes selected from the group consisting of disks, squares and rectangles.

15. The structure of claim 9, wherein the top surface of the electronic device is etched to form an even surface.

16. The structure of claim 9, wherein the top surface of the electronic device is sandblasted to form an uneven surface.

17. The structure of claim 9, wherein one or more grooves are etched into the top surface of the electronic device.

18. A computer system, comprising:
   a processor including a top surface;
   a microduct structure for providing temperature management to the processor, wherein the microduct structure has a height and a width and wherein the width of the microduct structure is an order of magnitude of greater than the height of the microduct structure; and
   an upper plate adjacent to the processor, wherein a bottom surface of the upper plate forms a top portion and sides of the microduct structure and the top surface of the processor forms a bottom portion of the microduct structure.

* * * * *